United States Patent [19]
Li et al.

[11] Patent Number: 6,060,433
[45] Date of Patent: May 9, 2000

[54] METHOD OF MAKING A MICROWAVE DEVICE HAVING A POLYCRYSTALLINE FERRITE SUBSTRATE

[75] Inventors: Yi-Qun Li, Tewksbury; Hua Jiang, Mansfield, both of Mass.

[73] Assignee: NZ Applied Technologies Corporation, Woburn, Mass.

[21] Appl. No.: 09/237,120

[22] Filed: Jan. 26, 1999

Related U.S. Application Data

[60] Provisional application No. 60/073,300, Jan. 26, 1998.

[51] Int. Cl.$^7$ ...................................................... H01L 39/24
[52] U.S. Cl. .......................... 505/473; 505/474; 505/475; 505/500; 505/731; 505/732; 505/742; 505/410; 505/728; 427/62; 427/595; 427/596; 427/419.3
[58] Field of Search ..................................... 505/239, 237, 505/728, 238, 473, 474, 742, 475, 410, 500, 731, 732; 427/62, 596, 419.3

[56] References Cited

U.S. PATENT DOCUMENTS

| | | | |
|---|---|---|---|
| 5,262,394 | 11/1993 | Wu et al. ...................................... | 505/1 |
| 5,484,765 | 1/1996 | Dionne et al. ............................ | 505/210 |
| 5,604,375 | 2/1997 | Findikoglu et al. ...................... | 257/661 |
| 5,635,453 | 6/1997 | Pique et al. .............................. | 505/239 |
| 5,650,378 | 7/1997 | Iijima et al. .............................. | 505/473 |
| 5,691,279 | 11/1997 | Tauber et al. ............................ | 505/239 |

OTHER PUBLICATIONS

D. E. Oates et al. "Tunable Superconducting Resonators Using Ferrite Substrates," 1997 IEEE MIT–S Microwave Symp. Digest, vol. 1, pp. 303–306 (Jun. 8–13, 1997).

A. T. Findikoglu et al., "Power–dependent microwave properties of superconducting YBa2Cu3O(7–x) films on buffered polycrystalline substrates," Appl. Phys. Lett., vol. 70, pp. 3293–3295 (Jun. 18, 1997).

R. B. Hammond et al., "Epitaxial T12CaBa2Cu2O8 thin films with low 9.6 GHz surface resistance at high power and above 77 K," Appl. Phys. Lett., vol. 57, pp. 825–827 (Aug. 1990).

Paul Arendt et al., "Fabrication of Biaxially oriented YBCO on (00 script I) Biaxially Oriented YTTRIA–Stabalized–Zirconia on Polycrystalline Substrates," Mat. Res. Soc. Symp. Proc., vol. 341, pp. 209–214 (1994).

C. C. Tsuei et al., "Superconducting Mercury–Based Cuprate Films with a Zero–Resistance Transition Temperature of 124 Kelvin," Science, vol. 263, pp. 1261–1263 (Mar. 1994).

(List continued on next page.)

*Primary Examiner*—Roy V. King
*Attorney, Agent, or Firm*—Mark Douma

[57] ABSTRACT

The invention provides a structure comprising a high temperature superconducting layer deposited on a ceramic polycrystalline ferrite plate suitable for making commercial microwave devices. In one embodiment, the high temperature superconductor is yttrium barium copper oxide (YBCO), the ferrite is yttrium iron garnet (YIG), and the microwave device is a phase shifter. The method of making this embodiment comprises, polishing the YIG plate, depositing biaxially oriented yttria-stabilized zirconia (YSZ) to form a crystalline template using an ion-beam-assisted-deposition technique, depositing a $CeO_2$ lattice matching buffer layer using pulsed laser deposition, depositing YBCO using pulsed laser deposition, and annealing the YBCO in oxygen. Etching the YBCO to form a meanderline patterned waveguide results in a high figure-of-merit microwave phase shifter when the device is cooled with liquid nitrogen and an external magnetic field is applied. Different patterns can be etched in the YBCO in order to make other well known ferrite-based microwave devices. Other oxide compounds can be used for ferrite plate and the high temperature superconductor.

15 Claims, 5 Drawing Sheets

OTHER PUBLICATIONS

X. D. Wu et al., "High current YBa2Cu3O(7–delta) thick films on flexible nickel substrates with textured buffer layers," Appl. Phys. Lett., vol. 65, pp. 1961–1963 (Oct. 1994).

A Fathy et al., "Miniature Circulators For Microwave Superconducting Systems," IEEE MIT–S Intl. Mic. Symp. Digest, vol. 1, pp. 195–198 (1995).

Gerald F. Dionne et al., "YBCO/Ferrite Low–Loss Phase Shifter," IEEE Trans. Appl. Supercond., vol. 5, pp. 2083–2086 (Jun. 1995).

A. Pique et al., "Microwave Compatible YBa2Cu3O(7–x) films on ferrimagnetic garnet substrates," Appl. Phys. Lett., vol. 67, pp. 1778–1780 (Sep. 1995).

X. D. Wu et al., "Properties of YBa2Cu3O(7–x) thick films on flexible buffered metallic substrates," Appl. Phys. Lett., vol. 67, pp. 2397–2399 (Oct. 1995).

Gerald F. Dionne et al., "Ferrite–Superconductor Devices for Advanced Microwave Applications," IEEE Trans. Mic. Th. Tech., vol. 44, pp. 1361–1368 (Jul. 1996).

A. T. Findikoglu, "Microwave Surface Resistance of YBa2Cu3O(7–x) films on polycrystalline ceramic substrates with textured buffer layers," Appl. Phys. Lett., vol. 69, pp. 1626–1628 (Sep. 1996).

D. E. Oates et al., "Tunable YBCO Resonators on YIG Substrates," IEEE Trans. Appl. Supercond., vol. 7, pp. 2338–2342 (Jun. 1997).

D. E. Oates et al. "Superconductor Ferrite Phase Shifters and Circulators," IEEE Trans. Appl. Supercond., vol. 7, pp. 2347–2350 (Jun. 1997).

S. L. Yan et al., "High critical current density in epitaxial HgBa2CaCu2Ox thin films," Appl. Phys. Lett., vol. 73, pp. 2989–2991 (Nov. 1998).

Q. X. Jia et al., "Superconducting YBa2Cu3O(7–x) thin films on polycrystalline ferrite for magnetically tunable microwave components," Appl. Phys. Lett., vol. 72, pp. 1763–1765 (Apr. 1998).

Ramesh et al, Appl. Phys. lett. 55(11), p. 1138–1140, Sep. 1989.

METHOD OF MAKING A MICROWAVE DEVICE HAVING A POLYCRYSTALLINE FERRITE SUBSTRATE

CROSS REFERENCE TO RELATED APPLICATION

This application claims priority from a provisional application with Ser. No. 60/073,300, filed Jan. 26, 1998, the entire contents of which are incorporated herein by reference.

STATEMENT OF GOVERNMENT SUPPORT

This invention was made with Government support under contract no. DASG60-97-C-0055 awarded by the Department of the Army. The Government has certain rights in this invention.

BACKGROUND

1. Technical Field

The invention relates to high temperature superconductors deposited on ferrimagnetic substrates and used to make microwave devices. More particularly, superconducting oxides, such as yttrium barium copper oxide (YBCO), are deposited on ferrimagnetic polycrystalline ceramics, such as yttrium iron garnet (YIG), and used to make practical microwave devices such as phase shifters, circulators, filters, and the like.

2. Background

Ferrite components have played an important role in microwave systems for nearly forty years. Their inherent capability of meeting demanding loss and power-handling requirements make them the technology of choice for many applications. Adjustable phase shifters, for example, are the principal beam-steering component of agile-beam phased-array radars. Ferrite circulators are used in radar systems to isolate transmitters from reflected energy and to direct return signals into receiver channels. Circulators can also be employed as switches in selective filter banks. More recently, magnetically tunable ferrite filters employing YBCO resonator circuits have been demonstrated and are expected to find use in both military and commercial systems.

However, normal metal microstrip, as opposed to waveguide-geometry, ferrite devices have had limited use at microwave frequencies because of high insertion losses resulting from resistance in the metal conductors. U.S. Pat. No. 5,484,765, issued Jan. 16, 1996, to Dionne et al., incorporated herein by reference, discloses Nb superconductor microstrip-geometry ferrite microwave devices. Nb must be operated below 9 K and the use of yttrium barium copper oxide (YBCO) was suggested because it is a high temperature superconductor with a transition temperature of about 90 K that is conveniently warmer than the 77 K temperature of liquid nitrogen. In addition, YBCO has a higher critical current density than other high temperature superconductors and has been much studied.

Results for YBCO-based microwave devices were reported in Dionne et al., "YBCO/Ferrite Low-Loss Microwave Phase Shifter," IEEE Trans. Appl. Supercond., vol. 5, pp. 2083–2086 (1995) and "Ferrite Superconductor Microwave Devices for Advanced Applications" IEEE Trans. Microw. Theory Tech., vol. 44, no. 5, pp. 1361–1368 (1996), both of which are incorporated herein by reference. The phase shifters disclosed in these references provide dramatically improved figures of merit (degrees of phase shift per dB of loss) compared with conventional microwave devices. As described therein, a magnetic toroid, at least one side of which is a flat polycrystalline yttrium iron garnet (YIG) plate is used to produce a magnetic field confined within the toroid. In the YBCO version, a thin film is deposited on a nonmagnetic single crystal lanthanum aluminate substrate with a meanderline pattern and the film side is mechanically pressed against the YIG plate. Microwave fields outside the superconductor interact gyromagnetically with the magnetic field in the YIG to produce substantial phase shift along the length of the meanderline. The toroidal shape keeps the magnetic field inside the toroid so that the superconductor's conduction is not affected. Figures of merit of 1000°/dB were obtained compared with 160°/dB for non-superconducting metal devices.

However, the magnetic circuit configuration required a mechanical press-fit assembly of a ferrite plate and YBCO deposited on a separate single-crystal substrate. This may be too cumbersome for production quality control and survival in harsh environments. A method of deposition of YBCO films directly on ferrite substrates would be a substantial improvement in realizing these superconductor/ferrite microwave devices. Unfortunately, growing high quality single crystal YBCO films on desirable substrates is not easy. Often, a transitional buffer layer of a more easily grown material must be deposited between the substrate and the YBCO to be either a better match for the YBCO crystal lattice size or prevent diffusion of the substrate material into the YBCO layers or both. A number of buffer materials and substrates have been tried.

One example is disclosed in U.S. Pat. No. 5,262,394, issued Nov. 16, 1993, to Wu et al., incorporated herein by reference. Wu discloses a buffer layer exemplified by $CeO_2$ deposited by pulsed laser deposition on a variety of single crystal substrates including yttria-stabilized zirconia (YSZ), but not including YIG. This yielded a critical current density, Jc, of about $10^7$ A/cm$^2$ for YBCO films that is close to the best obtained.

Examples using single crystal YIG substrates are disclosed in U.S. Pat. No. 5,635,435, issued Jun. 3, 1997 to Pique, et. al. wherein high quality YBCO thin films were deposited using two buffer layers. A laser ablation technique was used to epitaxially grow films with crystallographic orientations along the normal of [001]YBCO ∥[100]$BaZrO_3$ ∥[001]$SrZrO_3$ ∥[001]YIG. As reported in Pique et al., "Microwave Compatible $Yba_2Cu_3O_{7-x}$ films on ferrimagnetic garnet substrates," Appl. Phys. Lett., vol. 67, no. 12, pp 1778–1780 (1995), the YBCO film showed a superconducting transition temperature of 88–89 K with transition widths of about 0.5 K, Jc=2.7×10$^6$ A/cm$^2$, and surface resistance of 0.5 mΩ at 77 K nd 10 GHz. YIG is a very desirable substrate material for microwave devices because it has a low dielectric constant and a low loss tangent that reduce power dissipation. However, at present, single-crystal YIG is not available in large enough sizes and quantities for commercial devices and polycrystalline ceramic versions are usually preferred.

Growth on polycrystalline substrates presents an additional challenge because high critical current density and low microwave surface resistance are achieved only in near single-crystal YBCO films that are normally obtained through epitaxial growth on lattice-matched single-crystal substrates. The reason is that any high-angle grain boundaries mismatched in the a-b plane of YBCO films have the properties of Josephson weak links and lower macroscopic transport currents across the grain boundaries. Thus, a crystalline template for the YBCO must be grown on the polycrystalline substrate. Y. Iijima et al. "In-Plane Texturing Control of Y—Ba—Cu—O Thin Films on Polycrystalline Substrates by Ion-Beam Modified Intermediate Buffer Layers," IEEE Trans. Appl. Superconductivity, vol. 3., no. 1, March 1993, and U.S. Pat. No. 5,650,378, issued Jul. 22, 1997 to Iijima et al. (both of which are incorporated herein by reference) disclosed a deposition technique called Ion-Beam-Assisted-Deposition (IBAD). This technique was used to deposit on polycrystalline nickel alloys polycrystalline but biaxially oriented cubic YSZ films. In this orientation, in all the different grains, one axis is normal to the substrate and the other two axes are aligned within a few degrees of each other, i.e., the grain boundaries are at small angles. Using the YSZ as a template, conventional pulsed laser deposition was used to deposit biaxially oriented YBCO films with few high-angle grain boundaries. However, the critical current density of $4.3 \times 10^5$ A/cm$^2$ at 77 K was lower than that obtainable with YBCO films on single crystal substrates.

Findikoglu, et al., "Microwave surface resistance of $YBa_2Cu_3O_{7-x}$ films on polycrystalline ceramic substrates with textured buffer layers," Appl. Phys. Lett., vol. 69, pp. 1626–1628 (1996) used the IBAD technique to grow YSZ on polycrystalline alumina. (Alumina is a microwave substrate material that can be highly polished and its thermal expansion coefficient matches that of YBCO, but it is not ferrimagnetic.) Pulsed laser deposition techniques were used to deposit an additional $CeO_2$ buffer layer followed by YBCO. The best 10 GHz microwave surface resistance was measured as 1.89 mΩ that, according to the authors, is five times higher than comparable films grown on single crystal YSZ. A strong empirical inverse correlation with the average spread in grain boundary orientations was noted, but a quantitative explanation proved elusive.

SUMMARY OF THE INVENTION

The object of the invention is to provide a novel structure comprising a high temperature superconducting layer deposited directly on a ceramic polycrystalline ferrite plate suitable for making commercial microwave devices. The substitution of a superconductor for a normal metal conductor will yield superior performance in all cases. This also avoids the prior necessity of using a mechanical press fit of ferromagnetic plate against a planar superconducting waveguide deposited on a non-ferrimagnetic substrate.

In one embodiment, the high temperature superconductor is yttrium barium copper oxide (YBCO), the ferrite is yttrium iron garnet (YIG), and the microwave device is a phase shifter. The method of making this embodiment comprises obtaining a polished YIG plate, depositing a buffer layer comprising a biaxially-oriented yttria-stabilized zirconia (YSZ) layer to form a crystalline template using an ion-beam-assisted-deposition technique, depositing a $CeO_2$ lattice matching buffer layer using pulsed laser deposition, depositing YBCO using pulsed laser deposition, and annealing the YBCO in oxygen. This results in a YBCO film with low surface resistance due to the high quality of the resulting film.

Etching the YBCO to form a meanderline patterned waveguide results in a high figure-of-merit microwave phase shifter when the device is cooled with liquid nitrogen and an external magnetic field is applied. Different patterns can be etched in the YBCO film to make other ferrite-based microwave devices which had been made using normal metal films.

Other polycrystalline oxide ferrites could be used instead of the YIG. Also, other high temperature superconductors are known in the art could be used. In particular, $Tl_2Ba_2Ca_{n-1}Cu_nO_x$ (TlBaCaCuO) and $HgBa_2Ca_{n-1}Cu_nO_x$ (HgBaCaCuO), where $1 \leq n \leq 3$, have the highest known transition temperatures, >120 K nd 130 K, respectively. The known pulsed laser deposition method of making these embodiments on $LaAlO_3$ is the same as for YBCO, but the results would be enhanced because of close lattice match to the $CeO_2$ lattice matching layer used for the YBCO. The Hg-based superconductor could also be made by exchanging Hg for Tl cations in a precursor TlBaCaCuO film. DC magnetron sputtering can also be used for the TlBaCaCuO film.

DETAILED DESCRIPTION OF THE INVENTION

Figure 1:
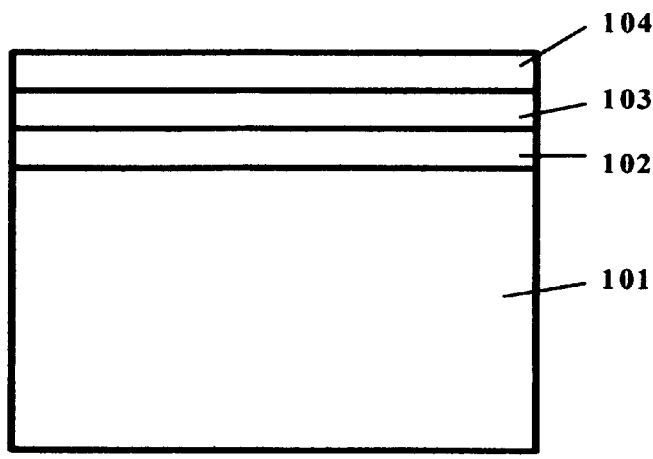
FIG. 1 illustrates a YBCO/CeO$_2$/YSZ multi-layer structure on a YIG ceramic substrate.

In one version of the invention, the material layer structure illustrated in basic form in FIG. 1 is used. The structure comprises a polycrystalline ferrite substrate 101, for example YIG, on which is deposited a biaxially oriented layer 102, for example, YSZ, on which is deposited a buffer layer 103, for example, CeO$_2$, on which is deposited a superconducting layer 104, for example, YBCO.

EXAMPLE

The following example demonstrates the details of making a microwave phase shifter in accordance with the material layer structure of the invention. The material used for the YIG substrate was type G113 purchased from Trans-Tech, Adamstown, Md. The physical properties of G113 are listed in the table below.

| | |
|---|---|
| Chemical Formula | $Y_3Fe_5O_{12}$ |
| Saturation Magnetization $4\pi M_s$ | 1.78 kG |
| Lande g-Factor g-eff | 1.97 |
| Line Width ΔH | <30 Oe |
| Dielectric Constant $\epsilon'$ | 15 |
| Dielectric loss, Tan $\delta = \epsilon''/\epsilon'$ | <0.0002 |
| Curie Temperature $T_c$ | 280° C. |
| Spine wave line width $\Delta H_k$ (Oe) | 1.43 Oe |
| Remanent Induction $B_r$ | 1.277 kG |
| Coercive force $H_c$ | 0.45 Oe |
| Initial Permeability $\mu_0$ | 134 |
| Thermal expansion coefficient | 8 μm/m/° C. |
| Size: | 1 cm × 1 cm × 1 mm |

As received, substrates were not flat and the surface roughness was about 150 nm. Although relatively thick intermediate layers would be deposited on the substrates, they were further mechanically polished using a diamond grit to about a 50 nm centerline average roughness as measured by a laser profilometer with a resulting 0.64 mm thickness. After polishing, samples were sent to Los Alamos Laboratory, Los Alamos, N. Mex., (a subcontractor of the assignee of the invention working under the direction of the inventors) for deposition of the layers. Los Alamos used the IBAD process to deposit YSZ and pulsed laser deposition to deposit $CeO_2$ and then YBCO. The IBAD process is described in detail in Iijima, supra, but a brief description follows. The process uses two ion guns that are typically cylinders with a gas inlet and hot filament at one end and a screen-type electrode at the other. The filament produces energetic electrons that ionize the, usually inert, gas and the screen electrode accelerates the ions out of the other end of the gun. One gun, the sputter gun is directed, at an angle of about 45°, toward a target plate composed of the material which it is desired to sputter deposit on a substrate. The ions from the sputter gun must have enough energy to eject material from the target plate. The other gun, the assist gun is directed toward the substrate. A critical parameter is the angle of the assist gun with respect to the substrate that is preferably from 40° to 60° from the plane of the substrate. Ions from the assist gun at the preferred angle promote growth of YSZ grains with their c-axis aligned normal to the substrate and their a- and b-axis biaxially aligned within 30° of each other. The mechanism is thought to be due to the directional nature of the ion bombardment as the YSZ grows on the substrate.

For this YSZ deposition, an ion gun with a beam diameter of 5 cm was used for the sputter gun and a beam diameter of 2.5 cm was used for the assist gun, both from Ion Tech, Inc., Fort Collins, Colo. The sputter gun was operated at 800 V and 100 mA of total beam current, while the assist gun was operated at 250 V and 150 uA/cm$^2$ as measured by a Faraday cup. Both used argon gas. The sputter target was composed of a zirconia ($Zr_2O_3$) polycrystalline ceramic with a 10 atomic % admixture of $Y_2O_3$. A total pressure of $1\times10^{-4}$ torr was maintained but $O_2$ was introduced to a partial pressure of $1.5–2.5\times10^{-4}$ torr. Under these conditions, the deposition rate, as determined by a quartz crystal oscillator, of YSZ films on the YIG substrate was about 250 nm/min. Samples with a total YSZ film thicknesses of about 600 nm to 800 nm were grown.

Next, a $CeO_2$ buffer layer was deposited using a, by now conventional, pulsed laser deposition process as illustrated by Iijima, supra, and described by Wu, supra. Essentially, a pulsed laser is used to eject material from a sputtering target. Typically, an excimer laser is used. In this case, it was a XeCl laser operating at 308 nm with a peak fluence of 2 J/cm2 on the target in 30 ns pulses. The target was not intentionally heated but the substrate was maintained at 800° C. in a 200 mtorr oxygen atmosphere. Although the purpose of the $CeO_2$ buffer layer is to provide a better lattice match for the subsequent YBCO layer, only a thin 20 nm film was used.

The YBCO layer was deposited under the same condition as the $CeO_2$, but the substrate was maintained at 780° C. The thicknesses were 300 nm. Subsequently, the samples were annealed at 450° C. in one atmosphere of oxygen for 30 minutes. A known alternative is to slowly cool in the same environment. As grown, YBCO is tetragonal and has a significant oxygen deficiency. On cooling to room temperature it converts to orthorhombic and picks up oxygen until seven oxygen atoms in each unit cell is approached.

Figure 2:
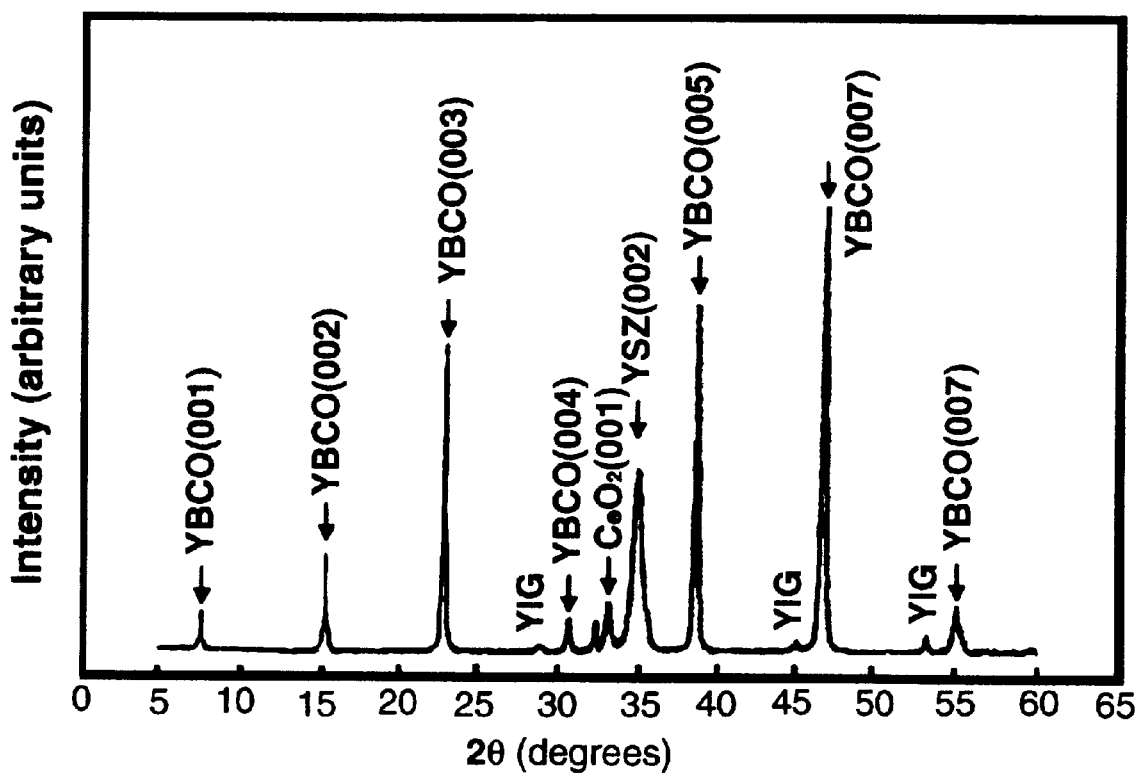
FIG. 2 shows an x-ray θ-2θ diffraction pattern of YBCO/CeO$_2$/YSZ multi-layers on a YIG ceramic substrate.
Figure 3:
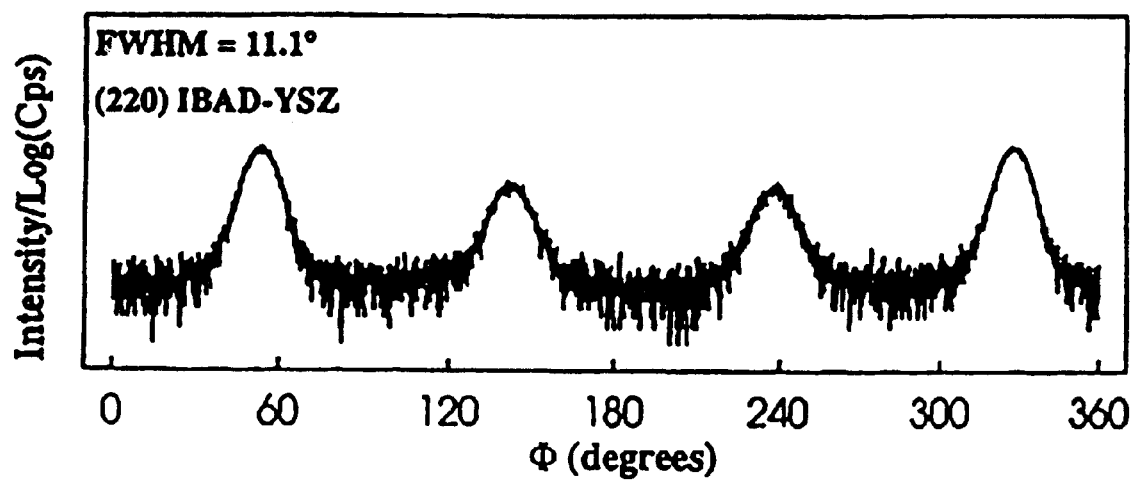
FIG. 3 shows an x-ray Φ scan of a YSZ thin films deposited on YIG ceramic substrate.
Figure 4:
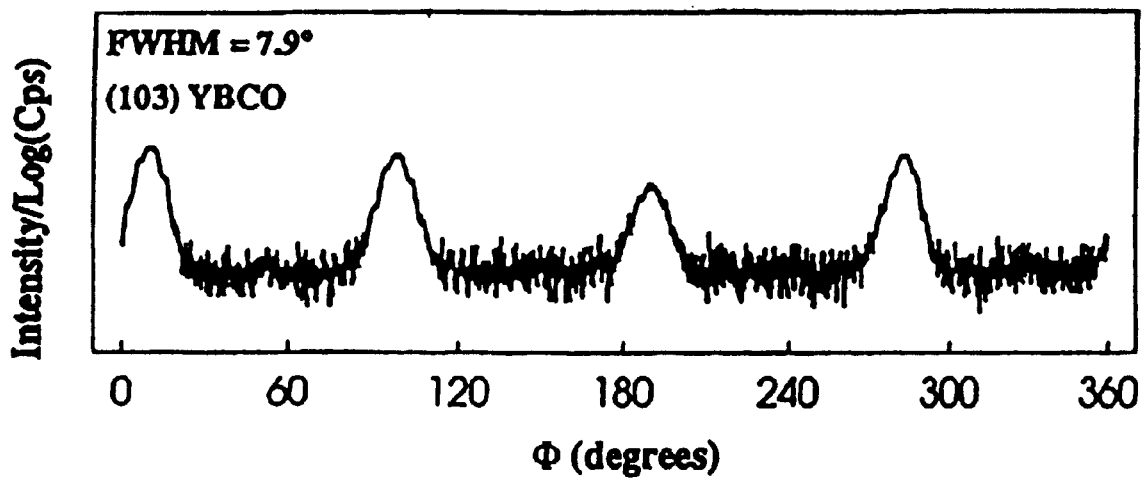
FIG. 4 shows and x-ray Φ-scan of YBCO and YSZ thin films deposited on CeO$_2$/YSZ buffered YIG ceramic substrate.
Figure 5:
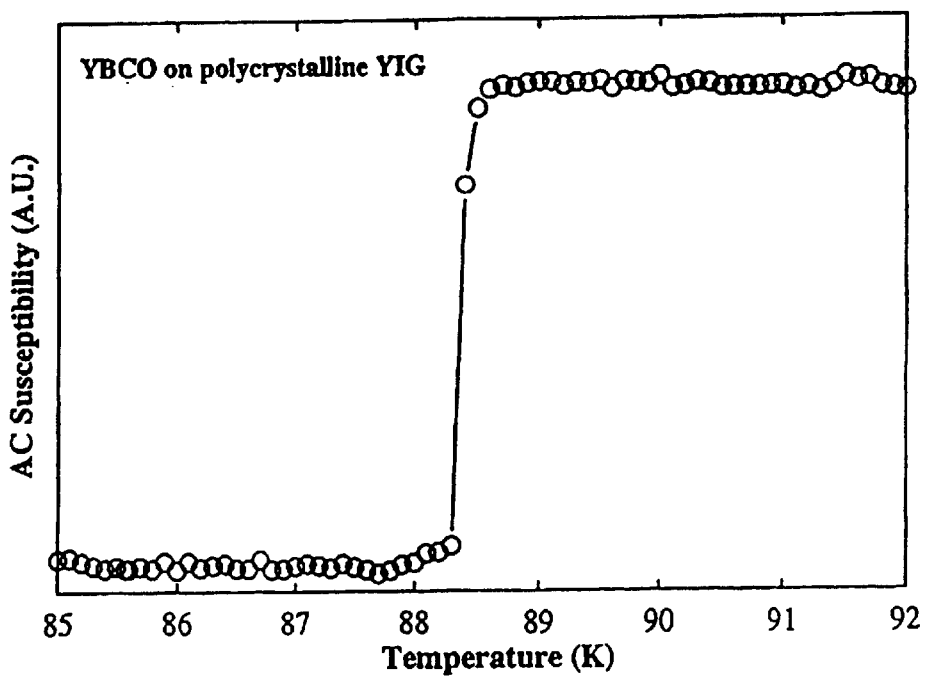
FIG. 5 shows a measurement of magnetic susceptibility as a function of temperature near the superconducting transition temperature for YBCO thin films deposited on a CeO$_2$/YSZ buffered YIG substrate.
Figure 6:
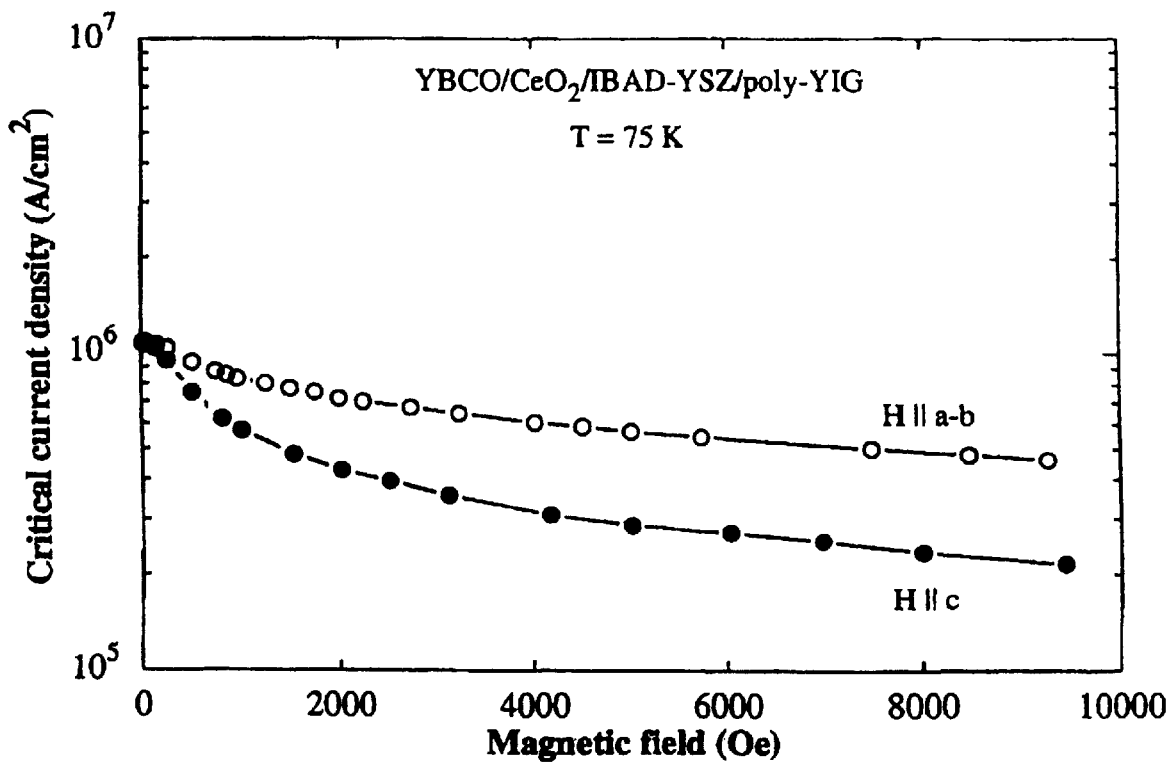
FIG. 6 shows a measurement of critical current density as a function of magnetic field at 77 K for YBCO thin films deposited on a CeO$_2$/YSZ buffered YIG substrate.

After receipt from Los Alamos, an x-ray θ-2θ diffraction pattern of the resulting YBCO/$CeO_2$/YSZ/YIG layer structure was produced, as shown in FIG. 2. The result shows that YBCO, $CeO_2$ and YSZ are highly oriented in (001) and the YIG ceramic substrate is a randomly oriented polycrystalline material. FIGS. 3 and 4 illustrate, respectively, a highly in-plane oriented (100)YSZ and (100)YBCO layers as determined by a x-ray Φ scan reflections every 90° apart. The full width of half maximum intensity (FWHM) was 11.1° for the YSZ layer and 7.9° for the YBCO layer. These results are better than those obtained on polycrystalline metal substrates. The excellent superconducting properties can be seen from the plot of ac susceptibility as a function of temperature shown in FIG. 5. The width of the superconducting transition is less than 0.2 K. FIG. 6 shows the critical current density as a function of magnetic field with a Jc=10$^6$ A/cm$^2$ at 77 K and zero field. As might be expected, the Jc is not as good as YBCO deposited on single crystal YIG, but surprisingly the microwave surface resistance of the film was 0.8 mΩ at 77 K and 10 GHz. Even though the YBCO films were the same thickness, the resistance was only 1.6 times larger than that for films grown on single crystal YIG as reported by Pique, supra, but one half the resistance of films grown on polycrystalline alumina as reported by Findikoglu, supra. Microwave surface resistance is important because it relates to the insertion losses in microwave devices.

Figure 7:
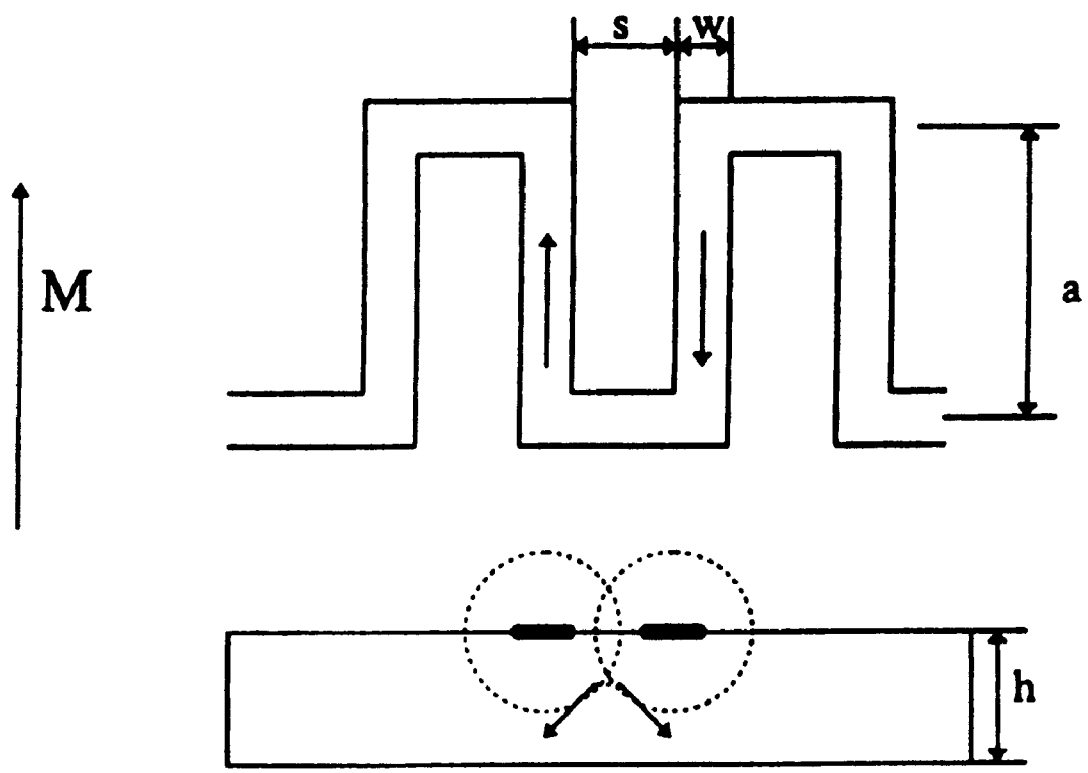
FIG. 7 illustrates a superconducting meanderline design for a nonreciprocal ferrite phase shifter.

A nonreciprocal microstrip meanderline phase shifter with the YBCO/$CeO_2$/YSZ/YIG layer structure was then fabricated from one of the samples with a 600 nm YSZ thickness. The YBCO film was patterned using conventional photoresist techniques. However, it is important not to use conventional inorganic acid etches such as 10% phosphoric acid because it is thought that this would degrade the microwave properties of the YBCO. Instead ethylenediamine tetra-acetic acid was used which also leaves the $CeO_2$ and YSZ layers and the YIG substrate untouched. The meander transmission line, as illustrated in FIG. 7, with dimensions, a=2.9 mm, s=0.2 mm, and w=350 μm, was designed for a central operating frequency of 9.5 GHz. The figure shows only two meander cycles, but the actual device had six. The number is selected to achieve the desired total phase shift that increases with each cycle. The figure also illustrates the gyromagnetic interaction of the traveling waves with the magnetic fields in the substrate with a thickness h=0.64 mm.

Figure 8:
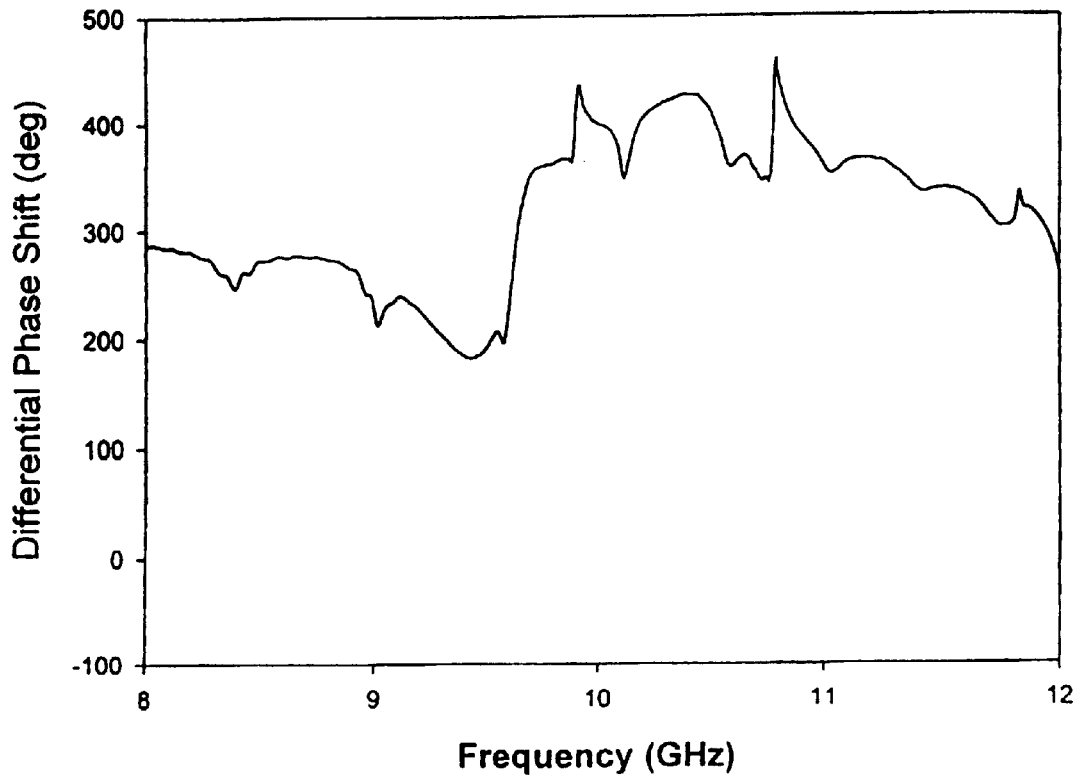
FIG. 8 shows a measurement of differential phase shift versus frequency for a phase shifter comprising a YBCO meanderline on a CeO$_2$/YSZ buffered YIG substrate.
Figure 9:
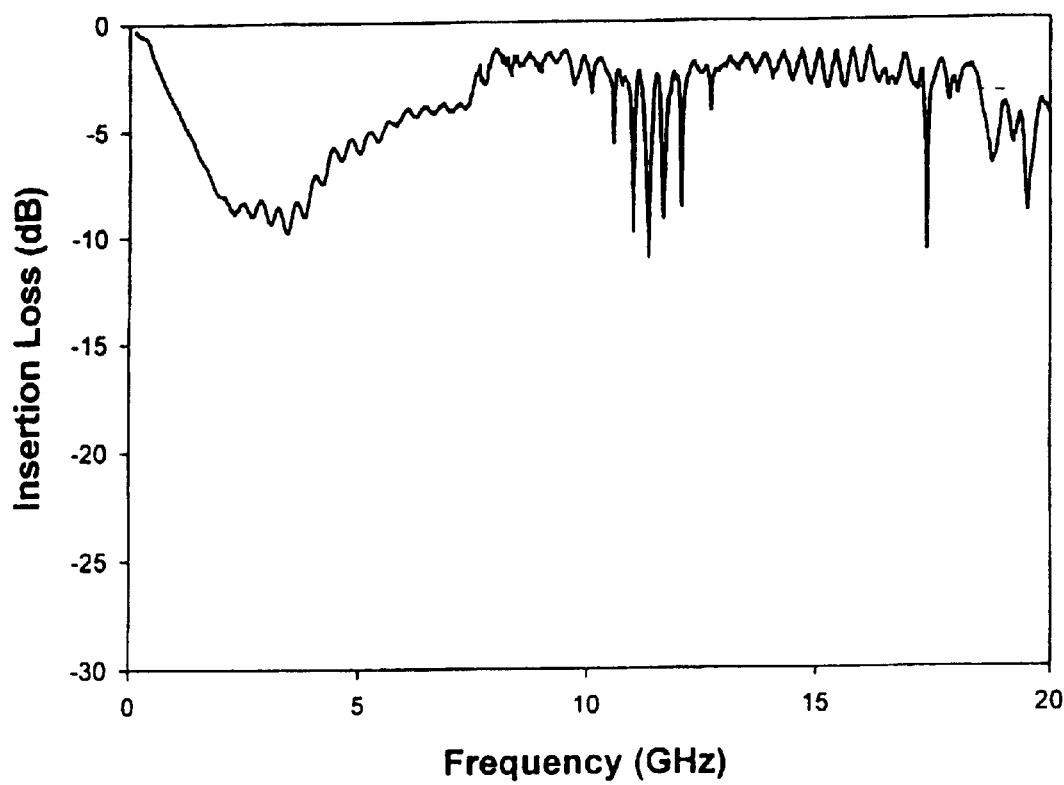
FIG. 9 shows a measurement of insertion loss versus frequency with extraneous losses included for a phase shifter comprising a YBCO meanderline on CeO$_2$/YSZ buffered YIG substrate.

The YIG was magnetized by applying a 100 Oe magnetic field during the phase shift measurement. At low phase shifter currents and with this low field, it is not necessary to use a toroid to confine the magnetic field to the substrate. A differential phase shift Δϕ, shown in FIG. 8, was determined by measuring the difference in phase between forward and backward-traveling waves for a fixed magnetization direction. The phase shift ranged from 300 to 400° over a wide frequency band of 5 to 12 GHz. The insertion loss, shown in FIG. 9, was about 1.2 dB over the frequency range of 8 to 10 GHz. After considering the external loses from the connecting cable and impedance mismatches, the absorption losses from the phase shifter device were estimated to be about 0.5 dB over this frequency band. The high absorption region at lower frequencies is caused by ferrimagnetic resonance that occurs when ferrite is partially magnetized. The upper frequency limit of this low field loss regime is determined by γ(4πM$_s$), where γ=2.8 Ghz/kG, which in this case is approximately 5 GHz for the ferrite with 4πM$_s$=1.8 kG at 77 K. The combination of measured phase shift and estimated insertion loss yields a figure of merit about 800°/dB over the 8 to 10 GHz frequency band.

This figure of merit is not as good as that obtained by Dionne, supra. However, only one sample was prepared and routine optimization may improve the results. It is felt that this is still good enough to justify using YBCO deposited on polycrystalline ferrimagnetic material. On the other hand, had the microwave surface resistance been twice as much, the figure of merit would likely have been half as much and only about twice that of a normal metal phase shifter. While a 50 nm polish is the standard for non-superconducting devices, it is rather coarse for epitaxial growth. It is possible to obtain a 12.5 nm polish that may improve growth quality, reduce the surface resistance, and increase the figure of merit. On the other hand, it may be possible to grow a thicker YSZ layer to overcome the surface roughness.

Other polycrystalline ferrite substrates could be used if they can stand the process temperatures and be polished to about 50 nm surface roughness. Examples are $NiFe_2O_4$, $MnFe_2O_4$, and $LiFe_2O_4$.

Success with YBCO, shows that other high temperature superconducting oxides could be used with a high expectation of success. Two of these, $Tl_2Ba_2Ca_{n-1}Cu_nO_x$ (Tl—Ba'Ca—Cu—O) and $HgBa_2Ca_{n-1}Cu_nO_x$ (Hg—Ba—Ca—Cu—O), where $1 \leq n \leq 3$, have the highest known transition temperatures, >120 K and 130 K, respectively. Another major advantage is a better lattice match to $CeO_2$ YBCO has lattice constants of a=3.82 A° and b=3.89 A° whereas that of $CeO_2$ is 5.41 A° so that YBCO is only lattice matched if it grows with a 45° tilt. The lattice constants of these others, however is about 5.4 A° so that they can grow without tilt in a cube-cube configuration. The one drawback is that Tl and Hg are both highly volatile and toxic so that great care must be taken to avoid laboratory contamination.

A method of growing Tl—Ba—Ca—Cu—O films on $LaAlO_3$ was reported by R. B. Hammond et al., "Epitaxial $Tl_2CaBa_2Cu_2O_8$ Thin films with Low 9.6 GHz Surface Resistance and High Power above 77 K," Appl. Phys. Lett., vol. 57, pp. 825–827 (1990), incorporated herein by reference. Because $CeO_2$ is not available as a standalone substrate, they used $LaAlO_3$, even though its lattice size is 3.79 A°. The also used pulsed laser deposition on a room temperature substrate to grow an amorphous Tl—Ba—Ca—Cu—O film and then annealed the film in $O_2$ and Tl vapor at 830–900° C. Unlike YBCO, this compound is too volatile to grow on high temperature substrates where single crystals could form. Crystallization takes place in the annealing phase. The final film was c-axis oriented and with a narrow full-width-at-half-maximum (FWHM) of 0.3°.

There are two possible processes for growing Hg—Ba—Ca—Cu—O films. The first is very similar to that for Tl—Ba—Ca—Cu—O, but Hg is substituted for Tl. See C. C. Tsuei et al., "Superconducting Mercury-Based Cuprate Films with a Zero-resistance Transition Temperature of 124 K," Science, vol. 263, pp. 1259– (1994), incorporated herein by reference.

In the second, and possibly preferable method, L. Yan et al., "High Critical Current Density in Epitaxial $HgBa_2CaCu_2O_x$ thin Films," Appl. Phys. Lett. 73, 2989, (1998), incorporated herein by reference, used a cation exchange method. They used DC magnetron sputtering to grow Tl—Ba—Ca—Cu—O amorphous films on a $LaAlO_3$ substrate. The result was placed in a vacuum sealed quartz tube with HgBaCuO and BaCaCuO pellets and then placed in a furnace and annealed at 700–800° C. for 3–12 hours during which Tl was exchanged for Hg cations. The final $HgBa_2CaCu_2O_x$ film was then annealed in flowing $O_2$ at 300° C. for one hour. The transition temperatures of the films made by this method were in the range of 120–124K. The critical current density was as high as $3.2 \times 10^6$ A/cm$^2$ at 77 K and $0.78 \times 10^6$ A/cm$^2$ at 110 K.

Since the YBCO films were grown on $CeO_2$ at 780° C., it is highly likely that the $CeO_2$/YSZ/YIG substrate would survive the processing of these other films.

Having describe the preferred embodiments sufficiently so that one skilled in the relevant arts could make them does not mean that the invention is limited to those, but includes other obvious modifications, variations, and equivalents.

What is claimed is:

1. A method of making a microwave device component comprising the steps of:
    a) selecting a polycrystalline ferrite substrate;
    b) depositing an intermediate buffer layer on said substrate;
    c) depositing a high temperature superconducting layer on said buffer layer; and
    d) etching said high temperature superconducting layer to make said microwave device component.

2. The method of claim 1 wherein step b) comprises the steps of depositing YSZ on said substrate and depositing a lattice matching layer on said YSZ layer.

3. The method of claim 2 wherein said step of depositing YSZ uses an ion beam assisted deposition process.

4. The method of claim 1 wherein:
    step a) further comprises placing said ferrite substrate in a deposition chamber;
    step b) comprises using an ion beam assisted deposition process to deposit a layer of YSZ followed by using a pulsed laser deposition process to deposit a lattice matching layer on said YSZ; and
    step c) comprises using a pulsed laser deposition process to deposit a high temperature superconducting oxide layer.

5. The method of claim 4 wherein in step b) said lattice matching oxide comprises $CeO_2$.

6. The method of claim 4 wherein in step c) said high temperature superconducting oxide layer comprises YBCO.

7. The method of claim 4 wherein in step c) said high temperature superconducting oxide comprises $HgBa_2Ca_{n-1}Cu_nO_x$ where $1 \leq n \leq 3$.

8. The method of claim 4 wherein in step b) said high temperature superconducting oxide comprises $Tl_2Ba_2Ca_{n-1}Cu_nO_x$ where $1 \leq n \leq 3$.

9. The method of claim 1 wherein:
    step c) further comprises depositing an amorphous layer and annealing in an oxygen atmosphere to produce a desired high temperature superconducting layer.

10. The method of claim 9 wherein said desired high temperature superconducting layer comprises $Tl_2Ba_2C_{n-1}Cu_nO_x$ where $1 \leq n \leq 3$.

11. The method of claim 9 wherein step c) further comprises using a cation exchange process to produce said desired high temperature superconducting layer.

12. The method of claim 11 wherein said desired high temperature superconducting layer comprises $HgBa_2Ca_{n-1}Cu_nO_x$ where $1 \leq n \leq 3$.

13. The method of claim 1 wherein step c) comprises depositing a precursor superconducting layer and using a cation exchange process to produce a desired superconducting layer.

14. The method of claim 13 wherein in step c) said deposition of said precursor layer comprises using DC magnetron sputtering.

15. The method of claim 14 wherein said desired high temperature superconducting layer comprises $HgBa_2Ca_{n-1}Cu_nO_x$ where $1 \leq n \leq 3$.

* * * * *